(12) United States Patent
Xiao et al.

(10) Patent No.: US 10,283,733 B2
(45) Date of Patent: May 7, 2019

(54) PACKAGING STRUCTURE FOR OLED DEVICE AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Ang Xiao, Beijing (CN); Hyun Chel Shin, Beijing (CN); Quanqin Sun, Beijing (CN); Xiangnan Wang, Beijing (CN); Fuyi Cui, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 0 days.

(21) Appl. No.: 15/234,419

(22) Filed: Aug. 11, 2016

(65) Prior Publication Data

US 2017/0256740 A1    Sep. 7, 2017

(30) Foreign Application Priority Data

Mar. 2, 2016 (CN) .......................... 2016 1 0119026

(51) Int. Cl.
*H01L 51/52* (2006.01)
*H01L 51/56* (2006.01)

(52) U.S. Cl.
CPC .......... *H01L 51/5256* (2013.01); *H01L 51/56* (2013.01)

(58) Field of Classification Search
CPC .......................... H01L 51/5256; H01L 51/56
See application file for complete search history.

(56) References Cited

U.S. PATENT DOCUMENTS

| 2010/0164369 A1* | 7/2010 | Yeh ..................... H01L 51/5256 313/504 |
| 2011/0121355 A1 | 5/2011 | Bae et al. |
| 2015/0053932 A1* | 2/2015 | Lin ..................... H01L 27/3244 257/40 |

(Continued)

FOREIGN PATENT DOCUMENTS

| CN | 104051668 A | 9/2014 |
| CN | 104269498 A | 1/2015 |

OTHER PUBLICATIONS

China Office Action, Application No. 201610119026.7, dated Mar. 22, 2017, 15 pps.: with English Translation.

*Primary Examiner* — Fernando L Toledo
*Assistant Examiner* — Neil R Prasad
(74) *Attorney, Agent, or Firm* — Armstrong Teasdale LLP

(57) ABSTRACT

A packaging structure for an OLED device is provided. The packaging structure includes a plurality of films coated on an outer side of the OLED device and comprising alternately stacked inorganic layers and organic layers, wherein both a film in contact with the OLED device and a film farthest from the OLED device are inorganic layers, wherein the inorganic layer in contact with the OLED device comprises at least two sub-films sequentially stacked, and wherein a contact angle between i) a material for forming a sub-film of the at least two sub-films that contacts an organic layer and ii) an organic material for forming the organic layer is smaller than a preset angle.

17 Claims, 2 Drawing Sheets

(56) References Cited

U.S. PATENT DOCUMENTS

2016/0322604 A1* 11/2016 Ho ..................... H01L 27/3244
2017/0133632 A1* 5/2017 Yang ................... H01L 51/5262
2017/0141348 A1* 5/2017 Yu ...................... H01L 51/5237

* cited by examiner

PACKAGING STRUCTURE FOR OLED DEVICE AND DISPLAY APPARATUS

CROSS REFERENCE TO RELATED APPLICATIONS

This application claims the benefit and priority of Chinese Patent Application No. 201610119026.7 filed on Mar. 2, 2016. The entire disclosure of the above application is incorporated herein by reference.

BACKGROUND

Embodiments described herein relate to a packaging structure for OLED device and a display apparatus.

Organic light-emitting diode (referred to as OLED) devices are widely used in the display industry since they have such advantages as solid-state structure, high brightness, full view angle, rapid response speed and capability of flexible display, etc. However, the water, oxygen and other ingredients in the air have a great influence on the life of the OLED device. Thus, in order to increase the service life of an OLED device, it is usually necessary to package the OLED device by using a packaging structure to isolate the OLED device from water, oxygen and other ingredients in the air.

In the prior art, a packaging structure for an OLED device comprises a plurality of films coated on the outer side of the OLED device which comprise alternately stacked inorganic layers and organic layers. Among the plurality of films, both the film in contact with the OLED device and the film farthest from the OLED device are inorganic layers. An inorganic layer is usually formed of SiNx (silicon nitride) material by using chemical vapor deposition (referred to as CVD). An organic layer is usually formed of organic material by using ink-jet printing process.

However, due to the large difference in wettability between the SiNx material and the organic material, resulting in large contact angle between the SiNx material and the organic material, it is difficult for the organic layer formed of the organic material to sufficiently spread on the inorganic layer formed of the SiNx material. Therefore, it is easy to form defects such as small holes in the organic layer, and the packaging structure cannot isolate the OLED device from water, oxygen and other ingredients in the air. As a result, the service life of the OLED device will be decreased.

Methods proposed in the prior art for reducing the defects such as small holes in the organic layer includes replacing the organic material for forming the organic layer, using a longer leveling time after the ink-jet printing process, or forming the organic layer after treating the surface of the inorganic layer by using plasma or ultra-violet ozone (referred to as UVO). However, such methods are expensive and would lengthen the unit production time of the production line. Accordingly, the applicability of above methods is poor.

BRIEF DESCRIPTION

Embodiments described herein provide a packaging structure for OLED device and a display apparatus.

A first aspect provides a packaging structure for OLED device. The packaging structure includes a plurality of films coated on outer side of the OLED device which include alternately stacked inorganic layers and organic layers, and among which both a film in contact with the OLED device and a film farthest from the OLED device are inorganic layers, wherein among the plurality of films, an inorganic layer in contact with the OLED device includes at least two sub-films sequentially stacked, and a contact angle between a material for forming a sub-film of the at least two sub-films that contacts an organic layer and an organic material for forming the organic layer is smaller than a preset angle.

In an example embodiment, among the plurality of films, each inorganic layer in contact with an organic layer, except an inorganic layer farthest from the OLED device, includes at least two sub-films sequentially stacked, and a contact angle between a material for forming a sub-film of the at least two sub-films that contacts the organic layer and organic material for forming the organic layer is smaller than the preset angle.

In an example embodiment, the preset angle is equal to 5 degree.

In an example embodiment, a material for forming the sub-film of the at least two sub-films that contacts the organic layer includes at least one of SiON and SiOx.

In an example embodiment, the material for forming the sub-film of the at least two sub-films that contacts the organic layer is SiOx.

In an example embodiment, a material for forming a sub-film of the at least two sub-films that does not contact the organic layer comprises SiNx.

In an example embodiment, the at least two sub-films included in the inorganic layer in contact with the OLED device include a first sub-film in contact with the OLED device, a third sub-film far from the OLED device and a second sub-film between the first sub-film and the second sub-film, wherein a material for forming the third sub-film includes at least one of SiON and SiOx, and a material for forming at least one of the first and second sub-films is SiNx.

In an exemplary embodiment, the material for forming the first sub-film is SiNx, the material for forming the second sub-film is SiON, and the material for forming the third sub-film is SiOx.

A second aspect of provides a display apparatus including an OLED device and the packaging structure for OLED device provided in the first aspect.

As described above, embodiments of the disclosure provide a packaging structure for OLED device and a display apparatus. The packaging structure for OLED device includes a plurality of films coated on outer side of the OLED device which include alternately stacked inorganic layers and organic layers and among which both a film in contact with the OLED device and a film farthest from the OLED device are inorganic layers. An inorganic layer in contact with the OLED device includes at least two sub-films sequentially stacked, and a contact angle between a material for forming a sub-film of the at least two sub-films that contacts an organic layer and an organic material for forming the organic layer is smaller than a preset angle. Since the contact angle between the material for forming the sub-film that contacts an organic layer in the inorganic layer in contact with the OLED device and the organic material for forming the organic layer is smaller than the preset angle, the organic layer can sufficiently spread on the inorganic layer. Therefore the defects such as small holes formed in the inorganic layer are avoided so that the packaging structure can isolate the OLED device from water, oxygen and other ingredients in the air and the service life of the OLED device is guaranteed. Furthermore, the packaging structure for OLED device and the display apparatus provided by the embodiments described herein have good applicability.

BRIEF DESCRIPTION OF THE DRAWINGS

In order to describe the technical solutions of the embodiments described herein more clearly, brief introduction to the drawings to be used in the description of the embodiments will be given hereinafter. Obviously, the drawings described hereinafter involve only some of the embodiments of the disclosure and shall not be deemed as limitations.

DETAILED DESCRIPTION

In order to make the technical solutions and advantages of the embodiments of the disclosure clearer, a clear and complete description to the technical solutions of the embodiments of the disclosure will be made hereinafter in conjunction with drawings of the embodiments of the disclosure. Obviously, the embodiments described are only some of rather than all of the embodiments of the disclosure. All other embodiments obtained by one of ordinary skill in the art based on the embodiments described herein without any creative work will all fall into the scope claimed by the disclosure.

Figure 1:
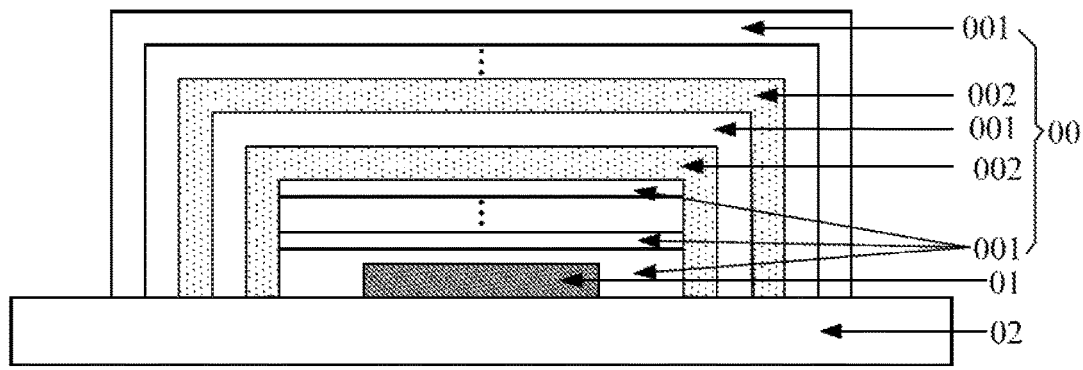
FIG. 1 is a schematic diagram illustrating a packaging structure for OLED device provided on outer side of an OLED device according to an embodiment.

FIG. 1 is a schematic diagram illustrating a packaging structure 00 for OLED device provided on outer side of an OLED device 01 according to an embodiment. With reference to FIG. 1, the packaging structure 00 for OLED device includes a plurality of films coated on outer side of the OLED device 01 which includes alternately stacked inorganic layers 001 and organic layers 002. Among the plurality of films, both the film in contact with the OLED device 01 and the film farthest from the OLED device 01 are inorganic layers 001.

As shown in FIG. 1, the OLED device 01 is provided on a base substrate 02. Among the plurality of films, the inorganic layer 001 in contact with the OLED device 01 includes at least two sub-films sequentially stacked. A contact angle between a material for forming a sub-film of the at least two sub-films that contacts an organic layer 002 and a material for forming the organic layer 002 is smaller than a preset angle.

According to the packaging structure for OLED device provided by the embodiment, since the contact angle between the material for forming the sub-film that contacts an organic layer in the inorganic layer in contact with the OLED device and the organic material for forming the organic layer is smaller than the preset angle, the organic layer can sufficiently spread on the inorganic layer. Therefore the defects such as small holes formed in the inorganic layer are avoided so that the packaging structure can isolate the OLED device from water, oxygen and other ingredients in the air and the service life of the OLED device is guaranteed.

Figure 2:
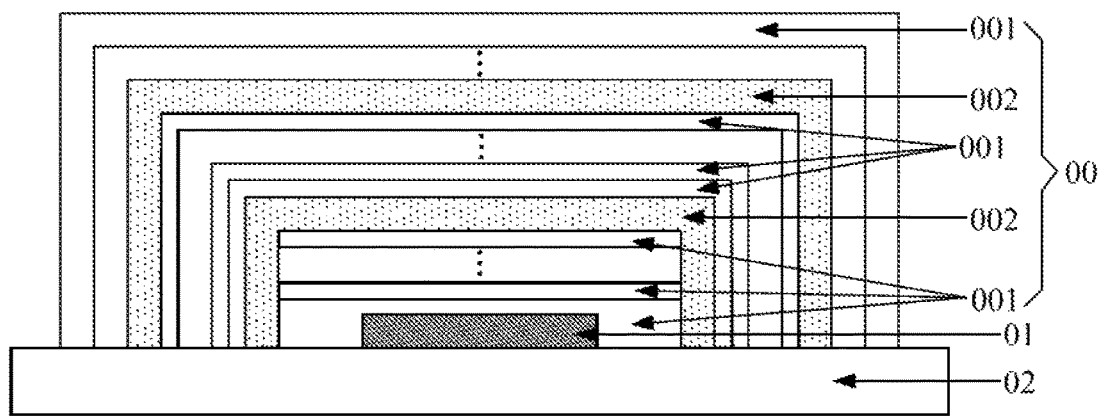
FIG. 2 is a schematic diagram illustrating another packaging structure for OLED device provided on outer side of an OLED device according to an embodiment.

FIG. 2 is a schematic diagram illustrating another packaging structure 00 for OLED device provided on outer side of an OLED device 01 according to an embodiment. Referring to FIG. 2, the packaging structure 00 for OLED device includes a plurality of films coated on outer side of the OLED device 01 which includes alternately stacked inorganic layers 001 and organic layers 002. Among the plurality of films, both the film in contact with the OLED device 01 and the film farthest from the OLED device 01 are inorganic layers 001.

As shown in FIG. 2, the OLED device 01 is provided on a base substrate 02. Among the plurality of films, the inorganic layer 001 in contact with the OLED device 01 includes at least two sub-films sequentially stacked. A contact angle between a material for forming a sub-film of the at least two sub-films that contacts an organic layer 002 and a material for forming the organic layer 002 is smaller than a preset angle.

In an exemplary embodiment and as shown in FIG. 2, among the plurality of films, each inorganic layer 001 in contact with an organic layer 002, except an inorganic layer 001 farthest from the OLED device 01, includes at least two sub-films sequentially stacked. A contact angle between a material for forming a sub-film of the at least two sub-films that contacts an organic layer 002 and a material for forming the organic layer 002 is smaller than a preset angle.

In an exemplary embodiment, the preset angle is equal to 5 degree. That is, the contact angle between the material for forming the sub-film of the at least two sub-films that contacts the organic layer 002 and the material for forming the organic layer 002 is smaller than 5 degree.

In an exemplary embodiment, the material for forming the sub-film of the at least two sub-films that contacts the organic layer 002 includes at least one of SiON (silicon oxynitride) and SiOx (silicon oxide). Since both SiON and SiOx contain oxygen atoms which enable SiON and SiOx chemically react with the organic material for forming the organic layer 002, the affinity of the inorganic layer 001 with the organic layer 002 is improved. Because the number of the oxygen atoms in SiOx is larger than or equal to that in SiON, SiOx is used to form the sub-film of the at least two sub-films that contacts the organic layer 002, but the disclosure is not limited thereto.

In an exemplary embodiment, the material for forming a sub-film of the at least two sub-films that does not contact the organic layer 002 includes SiNx. Using SiNx to form the sub-film not in contact with the organic layer 002 can ensure the packaging effect of the packaging structure 00.

Figure 3:
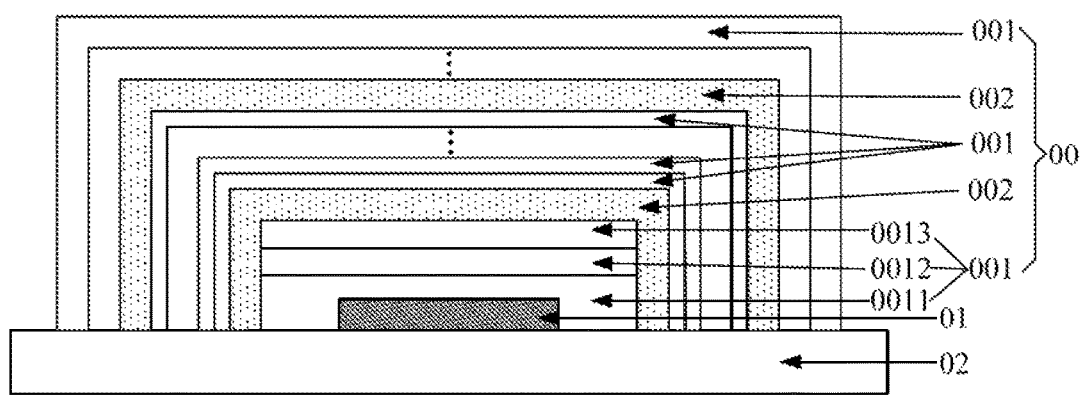
FIG. 3 is a schematic diagram illustrating a packaging structure for OLED device according to an example of the embodiment illustrated in FIG. 2 provided on the outer side of an OLED device.

In an example, as shown in FIG. 3, the at least two sub-films include in the inorganic layer 001 in contact with the OLED device 01 include a first sub-film 0011 in contact with the OLED device 01, a third sub-film 0013 far from the OLED device 01 and a second sub-film 0012 between the first sub-film 0011 and the third sub-film 0013. The material for forming the third sub-film 0013 includes at least one of SiON and SiOx, and the material for forming at least one of the first sub-film 0011 and the second sub-film 0012 is SiNx. In an exemplary embodiment, the first sub-film 0011 is formed of SiNx, the second sub-film 0012 is formed of SiON, and the third sub-film 0013 is formed of SiOx.

In the embodiments described herein, there is no limitation to the method for forming the inorganic layer 001 and the organic layer 002. For example, the inorganic layer 001 may be formed by using plasma enhanced chemical vapor deposition (referred to as PECVD), and the organic layer 002 may be formed by using ink-jet printing process. However, the disclosure is not limited thereto.

The organic layer 002 can flatten the surface of the inorganic layer 001 which contacts the organic layer 002 and is located between the organic layer 002 and the OLED device 01, and cover the foreign matter on the surface of the inorganic layer 001. Also, the organic layer 002 may eliminate the stress in the inorganic layer 001, which facilities the flexible display of the OLED device.

When the inorganic layer 001 includes at least two sub-films, the formation of the inorganic layer 001 may involve at least two PECVD processes for forming the at least two sub-films so as to obtain the inorganic layer 001, wherein each sub-film is formed by one PECVD process. When the inorganic layer 001 is a single-layer structure rather than including at least two sub-films, it may be formed by one PECVD process and SiNx is the necessary material to form it. Therefore, at least two sub-films may be formed of SiON or SiOx in the embodiments described herein and thus the at least two sub-films may be formed in a same PECVD equipment. However, the disclosure is not limited thereto.

In summary, according to the packaging structure for OLED device provided by the embodiments described herein, because the contact angle between the material for forming the sub-film that contacts an organic layer in the inorganic layer in contact with the OLED device and the organic material for forming the organic layer is smaller than the preset angle, the organic layer can sufficiently spread on the inorganic layer. Therefore the defects such as small holes formed in the inorganic layer are avoided so that the packaging structure can isolate the OLED device from water, oxygen and other ingredients in the air and the service life of the OLED device is guaranteed.

In the packaging structure for OLED device provided by the embodiments described herein, since the organic layer can sufficiently spread on the inorganic layer, the organic layer can cover the inorganic well, which lengthens the path for water, oxygen and other ingredients in the air to enter and ensures the capability of the OLED device to resist water and oxygen.

Furthermore, according to the packaging structure for OLED device provided by the embodiments described herein, it is unnecessary to replace the organic material, lengthen the leveling time or treat the surface of the inorganic layer, and thus the packaging structure for OLED device provided by the embodiments described herein have good applicability.

Furthermore, SiON and SiOx may be used to form the inorganic layer in exemplary embodiments described herein. Because the difference between the wettability of SiON and SiOx and that of the organic material is relatively small, the inorganic layer formed of SiON or SiOx has a good affinity with the organic layer formed of the organic material, which further avoids the formation of small holes or voids in the organic layer.

Embodiments described herein further provide a display apparatus comprising an OLED device and a packaging structure for OLED device that can be any of the packaging structures for OLED device in the above embodiments described herein.

In summary, the display apparatus provided by the embodiments described herein comprises an OLED device and a packaging structure of OLED device, in which the contact angle between the material for forming the sub-film that contacts an organic layer in the inorganic layer in contact with the OLED device and the organic material for forming the organic layer is smaller than the preset angle. Therefore the organic layer can sufficiently spread on the inorganic layer, which avoids the formation of defects such as small holes in the inorganic layer so that the packaging structure can isolate the OLED device from water, oxygen and other ingredients in the air, and the service life of the OLED device and the display apparatus is guaranteed.

The above description provides only exemplary embodiments rather than puts any limitations on the scope of the present invention that is defined by the appended claims.

What is claimed is:

1. A packaging structure for an OLED device, comprising:
   a plurality of films coated on an outer side of the OLED device and comprising alternately stacked inorganic layers and organic layers, wherein both a film in contact with the OLED device and a film farthest from the OLED device are inorganic layers, wherein the inorganic layer in contact with a top surface of the OLED device comprises at least two sub-films sequentially stacked, and wherein a contact angle between i) a material for forming a sub-film of the at least two sub-films that contacts an organic layer and ii) an organic material for forming the organic layer is smaller than a preset angle, wherein the preset angle is equal to 5 degrees.

2. The packaging structure according to claim 1, wherein among the plurality of films, each inorganic layer in contact with an organic layer, except an inorganic layer farthest from the OLED device, comprises at least two sub-films sequentially stacked, and wherein a contact angle between i) a material for forming a sub-film of the at least two sub-films that contacts the organic layer and ii) an organic material for forming the organic layer is smaller than the preset angle.

3. The packaging structure according to claim 1, wherein the material for forming the sub-film of the at least two sub-films that contacts the organic layer comprises at least one of SiON and SiOx.

4. The packaging structure according to claim 2, wherein the material for forming the sub-film of the at least two sub-films that contacts the organic layer comprises at least one of SiON and SiOx.

5. The packaging structure according to claim 3, wherein the material for forming the sub-film of the at least two sub-films that contacts the organic layer is SiOx.

6. The packaging structure according to claim 1, wherein the material for forming the sub-film of the at least two sub-films that does not contact the organic layer comprises SiNx.

7. The packaging structure according to claim 2, wherein the material for forming the sub-film of the at least two sub-films that does not contact the organic layer comprises SiNx.

8. The packaging structure according to claim 1,
   wherein the at least two sub-films of the inorganic layer in contact with the top surface of the OLED device comprise a first sub-film in contact with the OLED device, a third sub-film furthest from the OLED device, and a second sub-film between the first sub-film and the second sub-film; and
   wherein a material for thrilling the third sub-film comprises at least one of SiON and SiOx, and a material for forming at least one of the first and second sub-films is SiNx.

9. The packaging structure according to claim 2,
   wherein the at least two sub-films of the inorganic layer in contact with the top surface of the OLED device comprise a first sub-film in contact with the OLED device, a third sub-film furthest from the OLED device, and a second sub-film between the first sub-film and the second sub-film; and
   wherein a material for forming the third sub-film comprises at least one of SiON and SiOx, and a material for forming at least one of the first and second sub-films is SiNx.

10. The packaging structure according to claim 8, wherein the material for forming the first sub-film is SiNx, the material for forming the second sub-film is SiON, and the material for forming the third sub-film is SiOx.

11. A display apparatus comprising an OLED device and the packaging structure according to claim 1.

12. A display apparatus comprising an OLED device and the packaging structure according to claim 2.

13. A display apparatus comprising an OLED device and the packaging structure according to claim 3.

14. A display apparatus comprising an OLED device and the packaging structure according to claim 5.

15. A display apparatus comprising an OLED device and the packaging structure according to claim 6.

16. A display apparatus comprising an OLED device and the packaging structure according to claim 8.

17. A display apparatus comprising an OLED device and the packaging structure according to claim 10.

\* \* \* \* \*

UNITED STATES PATENT AND TRADEMARK OFFICE
CERTIFICATE OF CORRECTION

PATENT NO. : 10,283,733 B2  
APPLICATION NO. : 15/234419  
DATED : May 7, 2019  
INVENTOR(S) : Ang Xiao et al.

Page 1 of 1

It is certified that error appears in the above-identified patent and that said Letters Patent is hereby corrected as shown below:

In the Claims

In Claim 8, Column 6, Line 53, delete "material for thrilling the third" and insert therefor -- material for forming the third --.

Signed and Sealed this
Sixth Day of August, 2019

Andrei Iancu
*Director of the United States Patent and Trademark Office*